(12) United States Patent
Harada et al.

(10) Patent No.: US 8,900,512 B2
(45) Date of Patent: Dec. 2, 2014

(54) NI-BASED SINGLE CRYSTAL SUPERALLOY

(75) Inventors: Hiroshi Harada, Ibaraki (JP); Tadaharu Yokokawa, Ibaraki (JP); Yutaka Koizumi, Ibaraki (JP); Toshiharu Kobayashi, Ibaraki (JP); Masao Sakamoto, Ibaraki (JP); Kyoko Kawagishi, Ibaraki (JP); Ikuo Okada, Hyogo (JP); Hidataka Oguma, Hyogo (JP); Taiji Torigoe, Hyogo (JP); Masaki Taneike, Hyogo (JP); Eisaku Ito, Hyogo (JP); Junichiro Masada, Hyogo (JP); Keizo Tsukagoshi, Hyogo (JP); Hidemichi Koyabu, Hyogo (JP)

(73) Assignees: National Institute for Materials Science, Ibaraki (JP); Mitsubishi Heavy Indsutries, Ltd., Tokyo (JP)

( * ) Notice: Subject to any disclaimer, the term of this patent is extended or adjusted under 35 U.S.C. 154(b) by 238 days.

(21) Appl. No.: 13/144,748

(22) PCT Filed: Jan. 15, 2010

(86) PCT No.: PCT/JP2010/050428
§ 371 (c)(1),
(2), (4) Date: Sep. 29, 2011

(87) PCT Pub. No.: WO2010/082632
PCT Pub. Date: Jul. 22, 2010

(65) Prior Publication Data
US 2012/0014832 A1    Jan. 19, 2012

(30) Foreign Application Priority Data

Jan. 15, 2009 (JP) ................. 2009-006746

(51) Int. Cl.
| | | |
|---|---|---|
| C22C 19/05 | (2006.01) |
| F01D 5/28 | (2006.01) |
| C22F 1/00 | (2006.01) |
| C22F 1/02 | (2006.01) |
| C22F 1/10 | (2006.01) |
| C30B 11/00 | (2006.01) |
| C30B 29/52 | (2006.01) |

(52) U.S. Cl.
CPC ............. *F01D 5/28* (2013.01); *C22C 19/057* (2013.01); *C22F 1/00* (2013.01); *C22F 1/02* (2013.01); *C22F 1/10* (2013.01); *C30B 11/00* (2013.01); *C30B 29/52* (2013.01); *Y02T 50/671* (2013.01); *F05D 2300/607* (2013.01)
USPC .......................................................... 420/445

(58) Field of Classification Search
CPC ...................................................... C22C 19/057
USPC ............................................... 420/445, 442
See application file for complete search history.

(56) References Cited

U.S. PATENT DOCUMENTS

| | | | |
|---|---|---|---|
| 6,673,308 B2 | 1/2004 | Hino et al. | |
| 2004/0005238 A1 | 1/2004 | Arrell et al. | |
| 2005/0092398 A1* | 5/2005 | Kobayashi et al. | 148/404 |
| 2006/0174482 A1 | 8/2006 | Roedl et al. | |
| 2007/0102483 A1* | 5/2007 | Pietruska et al. | 228/101 |

FOREIGN PATENT DOCUMENTS

| | | | |
|---|---|---|---|
| GB | 2 105 748 | * 3/1983 | ............. C22C 19/05 |
| JP | 11-310839 | 11/1999 | |
| JP | 2002-146460 | 5/2002 | |
| JP | 2004-27361 | 1/2004 | |
| JP | 2006-233965 | 9/2006 | |

OTHER PUBLICATIONS

International Search Report issued Apr. 20, 2010 in International (PCT) Application No. PCT/JP2010/050428.

* cited by examiner

*Primary Examiner* — Jessee Roe
(74) *Attorney, Agent, or Firm* — Wenderoth, Lind & Ponack L.L.P.

(57) ABSTRACT

The Ni-based single crystal alloy disclosed here is a single crystal and has a chemical composition containing, as % by mass,
Co: 8 to 12%, Cr: 5 to 7.5%, Mo: 0.2 to 1.2%,
W: 5 to 7%, Al: 5 to 6.5%, Ta: 8 to 12%.
Hf: 0.01 to 0.2%, Re: 2 to 4%, Si: 0.005 to 0.1%,
with the balance of Ni and inevitable impurities.

2 Claims, 3 Drawing Sheets

NI-BASED SINGLE CRYSTAL SUPERALLOY

TECHNICAL FIELD

The present invention relates to an Ni-based single crystal superalloy.

BACKGROUND ART

In case where an Ni-based superalloy is used as the substrate of a turbine blade or a turbine vane of a jet engine or a gas turbine or the like, the combustion gas temperature in early-stage jet engines was not so high, and therefore the turbine blade and the turbine vane were used with no cooling. However, in a gas turbine engine such as typically a recent jet engine, the inlet port gas temperature of the turbine is kept higher for the purpose of increasing the output power and the efficiency thereof. With that, the turbine blade or the turbine vane for a large-scale power generation gas turbine is so designed as to have a hollow structure for maintaining the high-temperature strength thereof, in which the inside of the blade or the vane is forcedly cooled with air or vapor to thereby prevent the increase in the temperature of the substrate. In such a turbine blade or a turbine vane, the blade or vane surface temperature is higher than 900° C. and, on the other hand, the inside of the blade or vane is at 600° C. or so. The temperature difference between the blade or vane surface and the inside thereof produced thermo-mechanical fatigue (TMF).

In particular, a turbine blade is exposed to high-temperature combustion gas and at the same time rotates at high speed, and therefore it must be resistant to high stress resulting from centrifugal force, and for this requirement, high-temperature creep characteristics are also important like TMF.

Heretofore, an Ni-based superalloy intended to have thermo-mechanical fatigue resistance is known (Patent References 1, 2). An Ni-based superalloy excellent in creep characteristics (Patent Reference 3) has many past results in practical use in a variety of high-temperature instruments.
Patent Reference 1: Japanese Patent 2841970
Patent Reference 2: Japanese Patent 3214330
Patent Reference 3: U.S. Pat. No. 4,643,782

DISCLOSURE OF THE INVENTION

Problems that the Invention is to Solve

With the recent development of jet engines and gas turbines, the combustion gas temperature is elevated, and with that, an Ni-based superalloy more excellent in thermo-mechanical fatigue characteristics and creep characteristics and excellent in hot corrosion resistance is desired to appear.

Accordingly, a concrete target of the present invention is that the creep characteristic at 900° C./392 MPa is at least 600 hours, the creep characteristic at 1000° C./245 MPa is at least 160 hours, the TMF characteristic is at least 200 counts under the condition of a temperature range of from 400 to 900° C., a strain range of ±0.64%, a frequency of 66 min/cycle, a waveform of triangle wave+trapezoidal wave, a phase and an antiphase, and the hot corrosion resistance is at most 0.001 mm in terms of the corrosion loss when dipped in a salt of 75% $Na_2SO_4$+25% NaCl under heat at 900° C. for 20 hours.

An object of the invention is to provide an Ni-based single crystal superalloy excellent in TMF characteristics and creep characteristics and in hot corrosion resistance, and favorable for high-temperature members for use at high temperature under high tension such as turbine blades or turbine vanes of large-scale power generation gas turbines.

Means for Solving the Problems

For solving the above-mentioned problems, the invention has the following characteristics. The first invention is a single crystal and has a chemical composition containing, as % by mass,
Co: 8 to 12%,
Cr: 5 to 7.5%,
Mo: 0.2 to 1.2%,
W: 5 to 7%,
Al: 5 to 6.5%,
Ta: 8 to 12%.
Hf: 0.01 to 0.2%,
Re: 2 to 4%,
Si: 0.005 to 0.1%,
with the balance of Ni and inevitable impurities.

The second invention is, as subsidiary to the first invention, a single crystal and has a chemical composition containing, as % by mass,
Co: 8 to 11%,
Cr: 5 to 7%,
Mo: 0.2 to 1%,
W: 5.5 to 7%,
Al: 5 to 6%,
Ta: 9 to 12%.
Hf: 0.05 to 0.2%,
Re: 2.5 to 4%,
Si: 0.005 to 0.08%,
with the balance of Ni and inevitable impurities.

The third invention is, as subsidiary to the second invention, a single crystal and has a chemical composition containing, as % by mass,
Co: 8 to 10%,
Cr: 6 to 7%,
Mo: 0.5 to 1%,
W: 5.5 to 6.5%,
Al: 5 to 6%,
Ta: 9 to 11%.
Hf: 0.05 to 0.15%,
Re: 2.5 to 3.5%,
Si: 0.005 to 0.08%,
with the balance of Ni and inevitable impurities.

Advantage of the Invention

According to the invention, there is provided an Ni-based single crystal superalloy excellent in TMF characteristics and creep characteristics and in hot corrosion resistance, and the Ni-based single crystal alloy is favorable for high-temperature members for use at high temperature under high tension such as turbine blades or turbine vanes of large-scale power generation gas turbines.

MODE FOR CARRYING OUT THE INVENTION

Figure 1:
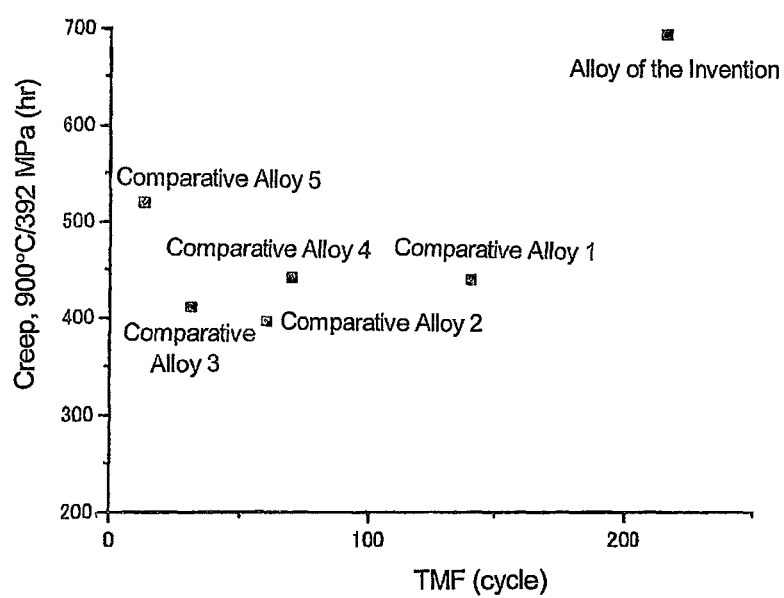
FIG. 1 is a view showing the creep characteristic at 900° C./392 MPa and the TMF characteristic (kept under compression for 60 minutes) of the alloys having the chemical composition shown in Table 1.

The reasons for the definition of the chemical composition of the Ni-based single crystal superalloy of the invention are as follows.

Co is an element to substitute for Ni in the gamma phase to thereby reinforce the matrix solid solution. In addition, it is an element that lowers the gamma prime solvus temperature to expand the solution temperature thereby having the effect of enhancing the heat treatment characteristics of the alloy. Its content is from 8 to 12% by mass. When less than 8% by mass, then the solution temperature range is narrow; but when more than 12% by mass, then the gamma prime amount decreases and the strength is lowered. The Co content is preferably from 8 to 11%, more preferably from 8 to 10%.

Cr is an element of enhancing hot corrosion resistance. Its content is from 5 to 7.5% by mass. When less than 5% by mass, then the corrosion resistance lowers; but when more than 7.5% by mass, a harmful phase forms and the high-temperature strength lowers. The Cr content is preferably from 5 to 7%, more preferably from 6 to 7%.

Mo is an element that promotes the raft effect, one reinforcement mechanism at high temperature enhanced by making the gamma/gamma prime misfit negative. Its content is from 0.2 to 1.2% by mass. Mo dissolves in the matrix to increase high-temperature strength, and contributes toward high-temperature strength through the raft effect and the precipitation hardening therein. When its amount is less than 0.2% by mass, then high-temperature strength lowers; but when more than 4% by mass, then a harmful phase forms and high-temperature strength lowers. The Mo content is preferably from 0.2 to 1%, more preferably from 0.5 to 1%.

W has the effect for solid solution reinforcement and precipitation hardening, like Mo. Its content is from 5 to 7% by mass. For obtaining the desired creep strength and TMF strength, its content must be at least 5% by mass; but addition of more than 7% by mass forms a harmful phase and lowers strength. The W content is preferably from 5.5 to 7%, more preferably from 5.5 to 6.5%.

Al compounds with Ni and forms an intermetallic compound represented by $Ni_3Al$ to constitute the gamma prime phase that precipitates in the gamma matrix phase, in a ratio by volume of from 50 to 70%, thereby increasing the TMF strength and the creep strength. Its content is from 5 to 6.5% by mass. When Al is less than 5% by mass, then the gamma prime phase amount is small and the necessary TMF strength and creep strength cannot be obtained; but even when more than 6.5% by mass, the necessary TMF strength and creep strength cannot also be obtained. The Al content is preferably from 5 to 6%.

Ta is an element effective for reinforcing the gamma prime phase to increase the TMF strength and the creep strength. Its content is from 8 to 12% by mass. When Ta is less than 8% by mass, then the necessary TMF strength and creep strength cannot be obtained; but when more than 12% by mass, then it promotes the formation of an eutectic gamma prime phase and therefore interferes with solution heat treatment. The Ta content is preferably from 9 to 12%, more preferably from 9 to 11%.

Hf has the effect of enhancing oxidation resistance and is effectively added as a chemical ingredient. Its amount to be added is from 0.01 to 0.2% by mass. When Hf is less than 0.01% by mass, then it is ineffective for antioxidation; but when more than 0.2% by mass, then it promotes the formation of a harmful phase therefore lowering the TMF strength and the creep strength. The amount of Hf to be added is preferably from 0.05 to 0.2%, more preferably from 0.05 to 0.15%.

Re dissolves in the gamma phase and improves high-temperature strength through solution reinforcement. In addition, Re has the effect of enhancing hot corrosion resistance. On the other hand, however, when Re is added too much, then a TCP phase precipitate at high temperature to lower the TMF strength and the creep strength. Accordingly, its amount to be added is from 2 to 4% by mass. When the amount is less than 2% by mass, then strength lowers; but when more than 4% by mass, then the TCP phase precipitate and the creep strength is thereby lowered. The amount of Re to be added is preferably from 2.5 to 4%, more preferably from 2.5 to 3.5%.

Si is an element effective for enhancing hot corrosion resistance and oxidation resistance. Its content is from 0.005 to 0.1% by mass. When the content is less than 0.005% by mass, then it is ineffective for anticorrosion and antioxidation. However, when more than 0.1% by mass, the desired creep strength cannot be obtained. The Si content is preferably from 0.005 to 0.08%.

The Ni-based single crystal alloy of the invention having the chemical composition as above can be produced, for example, according to the following process.

Starting materials to give the above-mentioned chemical composition are dissolved and cast to produce a cast single crystal, and then the cast single crystal is processed for solution treatment—primary aging—secondary aging to produce the Ni-based single crystal alloy of the invention. Regarding the condition for the solution treatment, for example, the cast single crystal is kept in a temperature range of from 1250 to 1350° C. for 1 to 20 hours, and then cooled with air. Regarding the condition for the primary aging treatment, for example, the single crystal is then kept in vacuum in a temperature range of from 1000 to 1200° C. for 1 to 10 hours, and then cooled with air. Regarding the condition for the secondary aging treatment, for example, the single crystal is then kept in vacuum in a temperature range of from 850 to 900° C. for 15 to 30 hours, and then cooled with air.

The condition to be employed for each treatment is suitably set in accordance with the chemical composition of the Ni-based single crystal superalloy.

Examples are shown below.

The invention is not limited to Examples.

EXAMPLES

TABLE 1

|  | Co | Cr | Mo | W | Al | Ti | Nb | Ta | Hf | Re | Si | Ni |
|---|---|---|---|---|---|---|---|---|---|---|---|---|
| Alloy of the Invention | 9.1 | 6.4 | 0.66 | 6.0 | 5.5 | — | — | 10.0 | 0.11 | 3.1 | 0.01 | Bal. |
| Comparative Alloy 1 | 9.0 | 8.5 | 0.6 | 5.0 | 5.6 | 1.0 | — | 6.5 | 0.1 | 3.0 | — | Bal. |
| Comparative Alloy 2 | 15.0 | 6.5 | 0.6 | 6.0 | 5.6 | 1.0 | — | 6.5 | 0.1 | 3.0 | — | Bal. |
| Comparative Alloy 3 | 13.0 | 6.0 | 1.0 | 5.5 | 6.0 | 2.5 | — | 3.5 | 0.1 | 3.0 | — | Bal. |
| Comparative Alloy 4 | 8.0 | 7.0 | 0.5 | 6.5 | 6.0 | 2.0 | — | 3.5 | 0.1 | 3.0 | — | Bal. |

TABLE 1-continued

|  | Co | Cr | Mo | W | Al | Ti | Nb | Ta | Hf | Re | Si | Ni |
|---|---|---|---|---|---|---|---|---|---|---|---|---|
| Comparative Alloy 5 | 9.0 | 6.5 | 0.6 | 6.0 | 5.6 | — | 2.0 | 6.5 | 0.1 | 3.0 | — | Bal. |
| Comparative Alloy 6 | 9.0 | 6.5 | 0.6 | 6.0 | 5.6 | 1.0 | — | 6.5 | 0.1 | 3.0 | — | Bal. |

The Ni-based superalloy having the composition shown in Table 1 was dissolved and cast at a solidification speed of 200 mm/hr in vacuum to prepare a cast single crystal. Next, the obtained, cast single crystal was preheated in vacuum at 1300° C. (10° C. unit—the same shall apply hereinunder) for 1 hour, then processed for solution treatment at 1330° C. for 10 hours followed by cooling with air, primary aging treatment in vacuum at 1100° C. for 4 hours followed by cooling with air, and secondary aging treatment in vacuum at 870° C. for 20 hours followed by cooling with air.

Thus cast, the single crystal alloy was worked into a creep test piece having a parallel rod diameter of 4 mm and a parallel rod length of 20 mm, and this was tested for a creep test under the condition of 900° C. and 392 MPa or 1000° C. and 245 MPa.

For a TMF test, the test piece was heated with high-frequency waves. In the TMF test, the temperature was varied from the lowermost limit 400° C. to the uppermost limit 900° C., and a strain of ±0.64% was imparted to the test piece. The temperature change and the strain impartation were cooperated. The frequency was 66 minutes in one cycle, the waveform was a triangular wave, and the sample was kept compressed for 60 minutes. The test condition is for simulating the driving condition of a gas turbine, and the turbine surface temperature was assumed to be 900° C. during constant driving and 400° C. during shutdown. The heating or cooling speed was 166.7° C./min.

Figure 2:
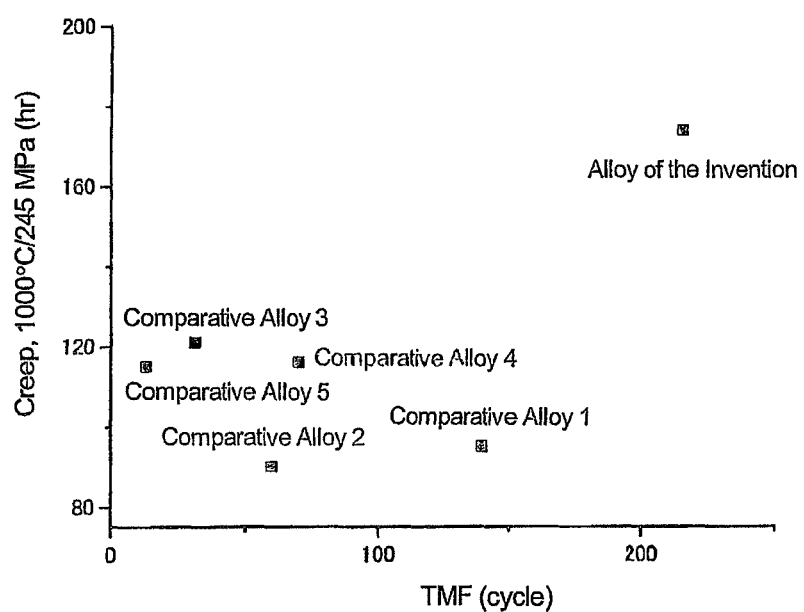
FIG. 2 is a view showing the creep characteristic at 1000° C./245 MPa and the TMF characteristic (kept under compression for 60 minutes) of the alloys having the chemical composition shown in Table 1.

FIGS. 1 and 2 show the results of the creep test and the TMF test.

Figure 3:
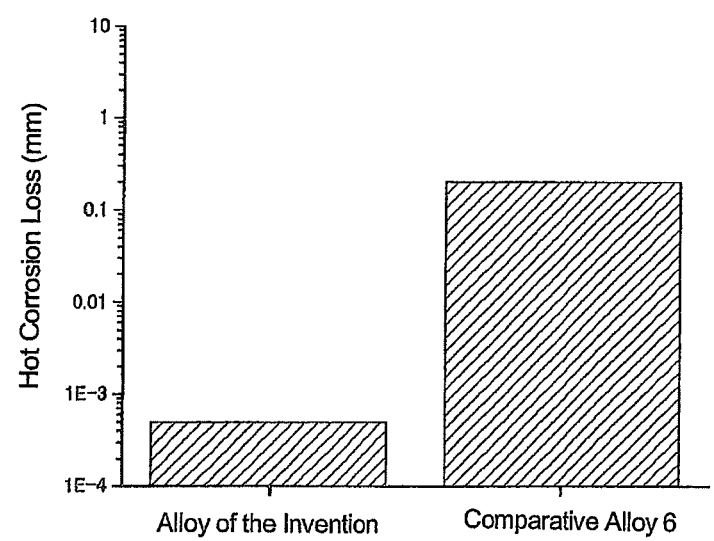
FIG. 3 is a view showing the result of the hot corrosion test of the alloy of an example the invention and the comparative alloy 6.

FIG. 3 shows the result of a hot corrosion test, in which a salt of 75% $Na_2SO_4$+25% NaCl was melted under heat at 900° C. and the sample was dipped in the molten salt for 20 hours. In FIG. 3, the vertical axis indicates the hot corrosion loss as length.

The results are shown in Table 2.

TABLE 2

|  | Creep Test | | TMF count | Hot Corrosion Test mm |
|---|---|---|---|---|
|  | 900° C./392 MPa hr | 1000° C./245 MPa hr | | |
| Alloy of the Invention | 694 | 174 | 216 | 0.0005 |
| Comparative Alloy 1 | 439 | 95 | 140 | — |
| Comparative Alloy 2 | 396 | 90 | 60 | — |
| Comparative Alloy 3 | 411 | 121 | 31 | — |
| Comparative Alloy 4 | 441 | 116 | 70 | — |
| Comparative Alloy 5 | 519 | 115 | 13 | — |
| Comparative Alloy 6 | — | — | — | 0.2044 |

Of the alloy of the invention, the creep characteristic at 900° C./392 MPa was more than 600 hours and that at 1000° C./245 MPa was more than 160 hours, the TMF characteristic was more than 200 counts under the above-mentioned condition, and the hot corrosion loss was less than 0.001 mm. The results confirm that the Ni-based single crystal superalloy which the invention provides here is excellent in TMF characteristics and creep characteristics and in sulfurization corrosion resistance.

INDUSTRIAL APPLICABILITY

The Ni-based single crystal superalloy of the invention is excellent in TMF characteristics and creep characteristics and in hot corrosion resistance, and is favorable for high-temperature members for use at high temperature under high tension.

The invention claimed is:

1. An Ni-based single crystal superalloy, which is a single crystal and has a chemical composition consisting of, as % by mass,
   Co: 8 to 11%,
   Cr: 5 to 7%,
   Mo: 0.2 to 1%,
   W: 5.5 to 7%,
   Al: 5 to 6%,
   Ta: 9 to 12%,
   Hf: 0.05 to 0.2%,
   Re: 2.5 to 4%,
   Ru: 0%,
   Ti: 0%
   Si: 0.005 to 0.08%,
with a balance of Ni and inevitable impurities.

2. The Ni-based single crystal superalloy as claimed in claim 1, which is a single crystal and has a chemical composition consisting of, as % by mass,
   Co: 8 to 10%,
   Cr: 6 to 7%,
   Mo: 0.5 to 1%,
   W: 5.5 to 6.5%,
   Al: 5 to 6%,
   Ta: 9 to 11%,
   Hf: 0.05 to 0.15%,
   Re: 2.5 to 3.5%,
   Ru: 0%,
   Ti: 0%
   Si: 0.005 to 0.08%,
with a balance of Ni and inevitable impurities.

* * * * *